United States Patent
Negri

(10) Patent No.: US 12,249,455 B2
(45) Date of Patent: Mar. 11, 2025

(54) HIGH VOLTAGE INSTRUMENT TRANSFORMER AND METHOD FOR PARTIAL DISCHARGE RECOGNITION

(71) Applicant: HSP Hochspannungsgeräte GmbH, Troisdorf (DE)

(72) Inventor: Fabrizio Negri, Nuremberg (DE)

(73) Assignee: HSP Hochspannungsgeräte GmbH, Troisdorf (DE)

( * ) Notice: Subject to any disclaimer, the term of this patent is extended or adjusted under 35 U.S.C. 154(b) by 178 days.

(21) Appl. No.: 18/015,430

(22) PCT Filed: Jul. 17, 2020

(86) PCT No.: PCT/EP2020/070371
§ 371 (c)(1),
(2) Date: Jan. 10, 2023

(87) PCT Pub. No.: WO2022/012762
PCT Pub. Date: Jan. 20, 2022

(65) Prior Publication Data
US 2023/0290566 A1    Sep. 14, 2023

(51) Int. Cl.
*H01F 27/40* (2006.01)
*H01F 27/02* (2006.01)
*H01F 38/36* (2006.01)

(52) U.S. Cl.
CPC ......... *H01F 27/402* (2013.01); *H01F 27/027* (2013.01); *H01F 38/36* (2013.01)

(58) Field of Classification Search
CPC ....... H01F 27/402; H01F 27/027; H01F 38/36
See application file for complete search history.

(56) References Cited

U.S. PATENT DOCUMENTS

| | | | |
|---|---|---|---|
| 4,914,382 A | | 4/1990 | Douville |
| 5,933,012 A | * | 8/1999 | Bengtsson ............ G01R 31/12 324/529 |
| 2018/0252760 A1 | * | 9/2018 | Andle ................. H02H 1/0015 |
| 2020/0400737 A1 | * | 12/2020 | Garnacho Vecino .. G01R 31/50 |

FOREIGN PATENT DOCUMENTS

| | | |
|---|---|---|
| CN | 104914359 A | 9/2015 |
| KR | 101608964 B1 | 4/2016 |

OTHER PUBLICATIONS

PCT International Search Report and Written Opinion of International Searching Authority mailed Mar. 15, 2021 corresponding to PCT International Application No. PCT/EP2020/070371 filed Jul. 17, 2020.
Jin, Jun: "Noise reduction and source recognition of partial discharge signals in gas-insulated substation"; May 24, 2006; pp. 1-268; XP055781252; Retrieved from the Internet: URL:https://core.ac.uk/download/pdf/48629282.pdf; retrieved on Mar. 3, 2021, p. 55-p. 63.

* cited by examiner

*Primary Examiner* — Scott Bauer
(74) *Attorney, Agent, or Firm* — David R. Stevens; Stevens Law Group

(57) ABSTRACT

A high voltage instrument transformer includes a measuring assembly and isolator, with at least one sensor for partial discharge measurements. A method for partial discharge recognition in high voltage instrument transformers includes a detection of a signal from at least one sensor for partial discharge measurements, particularly a Transient Earth Voltage sensor.

16 Claims, 1 Drawing Sheet

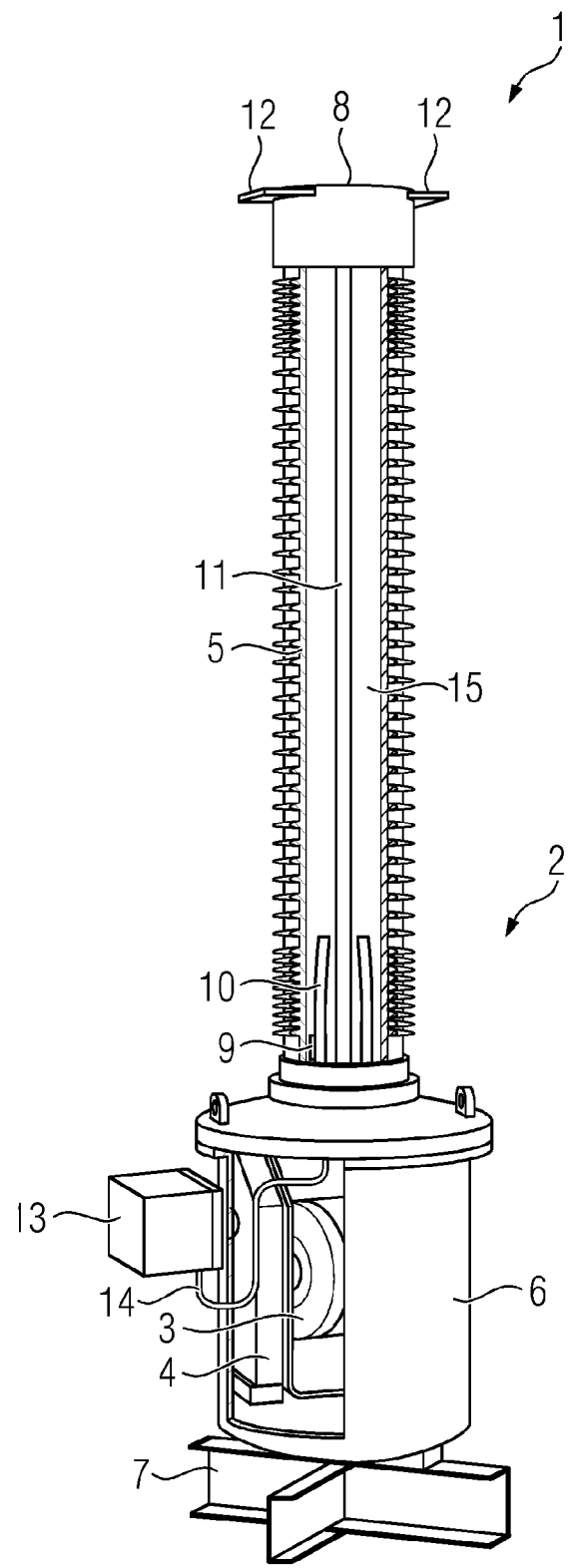

HIGH VOLTAGE INSTRUMENT TRANSFORMER AND METHOD FOR PARTIAL DISCHARGE RECOGNITION

CROSS REFERENCE TO RELATED APPLICATIONS

This application is the US National Stage of International Application No. PCT/EP2020/070371 filed 17 Jul. 2020, incorporated by reference herein in its entirety.

FIELD OF INVENTION

The present invention relates to a high voltage instrument transformer with measuring assembly and isolator, and to a method for partial discharge recognition.

BACKGROUND OF INVENTION

High voltage instrument transformers are measuring high voltages from a kilovolt to more than thousand kilovolts. In the grid and/or at high voltage units, as for example high voltage switches, bushings, surge arresters and/or transformers, high voltage instruments transformers measure voltages to monitor proper work of units and/or for example to switch of units at overvoltage. A reliable, continuous operation of high voltage instrument transformers without faults is essential for the grid and/or electrical units, to prevent costly damages and breakdowns.

For a proper operation, instrument transformers have to be monitored during operation. Nowadays, time-based maintenance is preferred to condition-based maintenance, based on continuous measurements made during service operations. Partial discharge is one of the most sensible indicators leading to a failure forecast. Monitoring an evolution of partial discharge is therefore of fundamental importance. Partial discharge occurs at or in solid isolators and in fluids for isolation, for example $SF_6$, Clean Air, and/or oil.

Partial discharge at or in solid isolators starts within voids, cracks, contaminants or inclusions, particularly at conductor-dielectric interfaces, and in liquids partial discharge starts particularly in bubbles, contaminants or inclusions. Since partial discharge is only limited to a portion of isolation, the discharge is only partially bridging the distance between conductors. As the partial discharge is initiated, high frequency transient current pulses will appear and persist for nano- to microseconds. Then the current pulses disappear and reappear repeatedly as a sinewave passes through the zero crossing. Detection and measuring of partial discharges are difficult, complex and cost intensive, due to high voltages and high levels of electrical background noise. Particularly in operation, partial discharges in high voltage applications are difficult to identify and to determine, and damages and/or electrical losses can be tremendous.

Measurements of partial discharge are performed for example by external antennas and/or external sensors. For example, grounded metal supporting frames of electrical units, spaced apart from the instrument transformer are used to measure partial discharge signals. Partial discharge induces voltage spikes on the surface of grounded metalwork, for example grounded metal supporting frames of electrical units, which is measured as electrical voltage and/or current signals. Another method to detect partial discharge uses ultrasonic sound sensors, arranged spaced apart from the instrument transformer. Particularly during on site measurements, described methods above provide only low sensitivity, require cost intensive equipment with high complexity.

SUMMARY OF INVENTION

An object of the present invention is to overcome the problems described above. Especially an object of the present invention is to improve sensitivity of partial discharge recognition and determination, enabling continuous measurements made during service operations, reduce costs by enabling partial discharge measurements with less complex equipment, reducing noise and improving measurement results.

The above objects are achieved by a high voltage instrument transformer, with measuring assembly and isolator, where at least one sensor for partial discharge measurements is comprised by the high voltage instrument transformer.

A sensor for partial discharge measurement, not spaced apart from the high voltage instrument transformer but comprised by the high voltage instrument transformer, improves sensitivity of partial discharge recognition and determination, enables continuous measurements during service operation, reduces costs by enabling partial discharge measurements with less complex equipment, reduces noise and improves measurement results.

The at least one sensor can be a Transient Earth Voltage sensor. Transient Earth Voltage sensors are for example used to measure induced voltages on grounded screens of gas isolated switchgears but are also able to catch conducted signals. At least one Transient Earth Voltage sensor comprised by a high voltage instrument transformer can measure partial discharge directly at and/or in the isolator of the high voltage instrument transformer particularly in form of voltage and/or current peaks, increasing sensitivity and reliability of partial discharge measurements and enabling continuous measurements during service operation.

At least a sensor can be arranged, particularly directly arranged on the ground screen, particularly a Transient Earth Voltage sensor. At least a sensor respectively the sensor can be electrically connected to the ground screen, particularly a sensor arranged on the ground screen. A Transient Earth Voltage sensor can be arranged and electrically connected to the ground screen. Partial discharges preferably propagate along capacitive paths. In the case of high voltage instrument transformers, when a partial discharge incepts, the partial discharge propagates through the bushing capacitance, for example represented by aluminum multi-shields, to the shielded ground, creating a closed circuit. To extract a measurable signal from this closed circuit is difficult. But since a high voltage instrument transformer is for example designed as to have the outer shield of the bushing connected to the ground screen, a connection of the at least one sensor, particularly the Transient Earth Voltage sensor, enables a partial discharge measurement with high sensitivity, continuous with time, with simple equipment at low cost and complexity. A signal, after flowing through the bushing, passes through the screen to "close" the electrical circuit, enabling a reliable partial discharge measurement.

Alternatively, and/or additionally an outer shield of the bushing of the high voltage instrument transformer can be electrically connected to ground screen.

Alternatively, and/or additionally at least a sensor can be arranged, particularly directly arranged on the outside surface of the isolator.

Alternatively, and/or additionally at least a sensor can be arranged inside of the isolator, particularly directly on the surface of the isolator.

Additional sensors can improve sensitivity and/or reliability and add additional information to measuring signals, enabling a high sensitivity, continuous measuring with time, with simple equipment at low cost and complexity, to reliable detect and determine partial discharge, with advantages as described before, for example prevention of damage and/or destruction of the grid and/or electrical units.

At least one sensor can be connected to a monitoring system, particularly a continuous and/or online monitoring system. The monitoring system, particularly the continuous and/or online monitoring system, can comprise a computer, and/or elements in the cloud, and/or mobile elements, for continuous monitoring and/or monitoring according to service intervals. A reliable monitoring of partial discharge, particularly in real-time, enables fast actions to prevent damage and/or destruction of the grid and/or electrical units. A condition-based maintenance is possible, preventing high costs and damages, and reducing efforts connected to time based maintenance for example in predefined periods of time.

The instrument transformer can be designed for voltages in the range of a kilovolt up to 1200 kV, particularly in the range of 15 kilovolt up to 1200 kV.

A method for partial discharge recognition in high voltage instrument transformers as described above, comprises a detection of a signal from at least one sensor for partial discharge measurements, particularly a Transient Earth Voltage sensor.

The method can comprise
a transformation of detected signals from time to frequency domain
cutting frequencies above a defined threshold value
retransform the truncated signals from frequency to time domain, and
determination and comparison of information content of detected and truncated signals.

Signals with comparable, particularly equal information content of detected and truncated signal can be identified as noise, and/or signals with lower information content of truncated signal compared to detected signal information content can be identified as signal including partial discharge information.

The determination of information content can be performed by a calculation of Shannon entropy. Entropy is a measure of the mean value of information content of the information. An information content of signals can be calculated. Claude Elwood Shannon defined the Entropy of a discrete, memoryless information source respectively discrete random variable H for a determined number of characters z. An information content $I(z)=-\log_2 p_z$ is assigned to every probability p of an event z respectively signal value. The entropy of the character z is defined as the expected value of the information content $H_1=-\Sigma p_z \log_2 p_z$ with probability $p_z$ of character z to occur. Summands with different probabilities do not add to the sum per definition. The entropy of a sign w with length n is $H_n=-\Sigma p_w \log_2 p_w$ with probability $p_w$ of sign w to occur. The probability H is derived as Limes $n \rightarrow \infty$ with $H=\lim(1\rightarrow\infty)Hn/n$.

Noise signals have no information content, since a value of the signals is randomly. Cutting off high frequencies does not change a Shannon entropy, since no information is lost. For partial discharge signals, cutting off frequencies reduces the Shannon entropy, since information content is lost. Comparison of Shannon entropy of signals as measured and Shannon entropy of truncated signals results in same values for pure noise, and lower values of Shannon entropy of truncated signals compared to Shannon entropy of signals as measured for signals comprising partial discharge. The occurrence of partial discharge can be identified, and a value of partial discharge can be calculated, with advantages as described above.

The advantages in connection with the described method for partial discharge recognition in high voltage instrument transformers as described above, according to the present invention, are similar to the previously, in connection with the high voltage instrument transformer described advantages.

The method according to the present invention enables partial discharge measurements with less complex equipment, reducing noise and improving measurement results, by identifying and distinguishing partial discharge and noise by analyzing the information content of signals after cutting off higher frequencies of measured signals above a certain threshold.

A fast and particularly automatic determination and/or comparison of information content allows for example a monitoring with time of partial discharge events and a fast reaction to protect equipment, for example by switching off of electrical lines. Maintenance can be initiated for equipment respectively units which show partial discharge events once and/or more often. A warning signal can be produced and/or transmitted for example on side and/or online via cable internet or mobile network, or partial discharge events can be monitored online for example via internet over periods of time.

BRIEF DESCRIPTION OF THE DRAWINGS

The present invention is further described hereinafter with reference to an illustrated embodiment shown in the accompanying drawing, in which FIG. 1 shows in sectional view a high voltage instrument transformer 1 according to the present invention, with a Transient Earth Voltage sensor 9 on the ground screen 10 to measure partial discharge.

DETAILED DESCRIPTION OF INVENTION

In FIG. 1 a high voltage instrument transformer 1 according to the present invention is shown. The high voltage instrument transformer 1 comprises a housing 2 with isolator 5 and vessel 6, particularly a high-pressure vessel. The isolator 5 is hollow, columnar, with rips on the outer surface to increase leakage current lengths. The columnar isolator 5 is arranged upstanding on the vessel 6, with excess pressure means 8, particularly a bursting disc, and high voltage terminals 12 on top. High voltage in the range of kilovolt up to 1200 kV can be applied to the high voltage instrument transformer 1 via terminals 12, to measure for example voltages in the grid and/or at electrical lines, and/or at electrical units like bushings, high voltage switches, transformers, and/or surge arresters.

The isolator 5 is made of materials and/or comprises materials as for example ceramic, silicone and/or composite materials. The vessel 6 is made of materials and/or comprises materials as for example metals like aluminum, steel, and/or cast iron. The vessel 6 is arranged on a base with earth connection 7, for example made of steel on a concrete basement. Outside the vessel 6 a terminal box 13 is arranged with for example electric terminals and/or electronics, for example to measure voltages, process signals and transfer signals/information to monitoring devices. For example, computer, sense boxes, data receiver and/or transmitter for particularly online monitoring like mobile units and/or data cable units/online units for internet, are arranged in terminal box 13.

A measuring assembly to measure high voltages is arranged for example in the vessel 6, comprising particularly a primary winding 3 and a voltage transformer core 4. High voltage terminals 12 of the high voltage instrument transformer 1 on top of the isolator 5 are electrically connected via a bushing 11, particularly comprising a metal bar made of aluminum, steel and/or copper, to the measuring assembly in the vessel 6. The metal bar is surrounded by control electrodes embedded for example in isolator paper, not shown in FIG. 1 for reasons of simplicity, and at the passage from isolator 5 to vessel 6 a ground screen 10, for example made of a metal like copper, aluminum and/or steel, is arranged. Isolator 5 and vessel 6 are particularly filled by a fluid for isolation 15, for example an isolation gas like $SF_6$, Clean Air and/or an isolation liquid like oil.

According to the present invention, a partial discharge sensor 9, particularly a Transient Earth Voltage sensor, is arranged at, particularly directly on the ground screen 10 and/or electrical connected to the ground screen 10. Partial discharges preferably propagate along capacitive paths. When a partial discharge incepts in or at the isolator 5, the partial discharge propagates through the bushing capacitance, for example represented by aluminum multi-shields, to the shielded ground, creating a closed circuit. A signal, after flowing through the bushing, passes through the screen to "close" the electrical circuit, enabling a reliable partial discharge measurement.

Alternatively, and/or additionally, not shown in FIG. 1 for reasons of simplicity, an outer shield of the bushing of the high voltage instrument transformer can be electrically connected to ground screen. Alternatively, and/or additionally, not shown in FIG. 1 for reasons of simplicity, further sensors can be arranged, particularly directly arranged on the outside surface of the isolator 5, and/or inside of the isolator 5, particularly directly on the surface of the isolator.

The partial discharge sensor 9, particularly Transient Earth Voltage sensor, is electrically and/or optically connected for example by a connection wire 14 to terminal box 13. Signals measured with sensor 9 are directly or processed transmitted to terminal box 13, for example to be processed further and transmitted to a central control room, to mobile devices and/or to be locally displayed for example at an alarm light. A monitoring, continuously or in particularly predefined periods of time, of the condition of the high voltage instrument transformer 1 is possible with sensor 9, for example via mobile and/or cable/internet connection to a central control and/or devices in the cloud.

The partial discharge is a localized dielectric breakdown of the electrical isolation at high voltages between electrical poles, introducing alternating voltages and/or currents in or at the isolator 5. Partial discharge signals are for example measured in form of voltage with time. The partial discharge signal is small compared to the high voltage at terminals 12, with high voltage for example in the range of a kilovolt up to 1200 kV, compared to some picocoulomb signals of partial discharge, i.e. small voltage and current signals. The partial discharge at or in the isolator 5 starts for example within voids, cracks, contaminants or inclusions, particularly at conductor-dielectric interfaces, and in liquids partial discharge starts particularly in bubbles, contaminants and/or inclusions. The partial discharge is only limited to a portion of isolation. The discharge is only partially bridging the distance between the poles respectively between electrical conductors.

As the partial discharge is initiated, high frequency transient current pulses appear and persist for nano- to microseconds. Then the current pulses disappear and reappear repeatedly as for example a sinewave passes through the zero crossing. The partial discharge signals are short in duration and exhibit rise times of currents in the range of nanoseconds. High levels of electrical background noise, for example due to corona, crosstalk and other effects, make a correct measurement and simple recognition and determination of partial discharge within a measured signal of high voltage/currents difficult.

Due to the short duration and due to rise times in the range of nanoseconds of partial discharge currents in high voltage applications, a visualization and distinguishing between noise and partial discharge in voltage/current against time plots is difficult. To identify partial discharge and/or to determine a value of partial discharge, according to the present invention the information content I of a signal S is investigated. Measured signals with time S (t) are transformed from time to frequency domain for example by Fourier Transform and/or Discrete Cousin Transform. Frequencies f above a predefined frequency limit $f_{lim}$ are cut off and truncated signals are obtained, by removing the signal components at frequencies higher than $f_{lim}$. The value of frequency limit $f_{lim}$ is for example defined every time at the beginning of a monitoring activity respectively measurement. In a step after removing frequencies f above a predefined frequency limit $f_{lim}$, signals are transformed back respectively retransformed from frequency to time domain.

Partial discharge signals contain an information, while noise signals do not contain information. Noise signals are completely uncorrelated among themselves. By switching from the time domain to the frequency domain, each component has a part of the global information Ii. By cutting off parts of the signal above frequency limit $f_{lim}$, information is lost, if the measured signal comprises partial discharge and does not consist only of noise. According to the present invention the method respectively algorithm is to extract the information from the sampled signals, for example by calculating the Shannon entropy, and compare the information content of the sampled signal with the information content of the truncated signal, derived by cutting off frequencies of the signal above frequency limit $f_{lim}$.

The information content of the measured respectively sampled signals is calculated, particularly by a computer locally and/or in the cloud, as described above for example by calculating the Shannon entropy, and the information content of the truncated signal respectively signal after cutting off frequencies is calculated, particularly by a computer locally and/or in the cloud, likewise as described above for example by calculating the Shannon entropy. Both calculations are for example performed in time with measurements or separately one after another, or in a predefined order. After removing frequency components, a time domain signal for the truncated signal is obtained for example by the inverse integral transform, particularly by Fourier Transform and/or Discrete Cousin Transform. The determination of information content of measured and truncated signals is analogous, for example in both cases by calculating the Shannon entropy.

A comparison of information content of the measured and truncated signals results in a recognition and/or determination of partial discharge. A comparison is performed for example manually and/or automatically, for example by a computer and/or in the cloud. Methods to compare signals include for example division and/or subtraction of the information content of the measured and truncated signals. For division a result is smaller than one, if a measured signal comprises partial discharge. Without partial discharge is a division result, which is exactly or mainly one, since a signal consists only of noise, and no information is lost by cutting off frequencies.

A recognition and/or determination of partial discharge has advantages as described above, for example a warning can be provoked and/or transmitted and further actions triggered, for example switching off voltage and/or disconnecting high voltage units from the grid, to avoid damage and/or destruction/failure of the units. Partial discharge measurements are also providing quality assessment and diagnostic results. The partial discharge is for example an indicator for the status of the high voltage instrument transformer 1 under test. It is performed in factory quality tests, to show proper function of produced units. In operation in the grid, with a lot of background noise, an online monitoring on high voltage units, for example high voltage switches, bushings, and/or transformers, is possible.

The above described embodiments of the present invention can be used also in combination and combined with embodiments known from the state of the art. For example, partial discharge can be detected by once performing the steps, particularly all steps as described before. A higher reliability is reached by performing the steps, particularly all steps as described before, repeated. An iteration method to determine partial discharge can include determining a value of frequency limit $f_{lim}$. An iteration method can comprise repeating steps according to the present invention, and changing cut off frequency limit $f_{lim}$, till a change of Shannon entropy occurs and/or no change of Shannon entropy occurs with changed frequency limit $f_{lim}$.

Additional sensors, particularly Transient Earth Voltage sensors, optical, acoustic, and/or electrical sensors, can be comprised by the high voltage instrument transformer 1 and/or combined used with external sensors, to improve sensitivity and/or reliability, and to add additional information to measuring signals, enabling a high sensitivity, continuous measuring with time, with simple equipment at low cost and complexity, to reliably detect and determine partial discharge, with advantages as described above, for example prevention of damage and/or destruction of electrical units and/or the grid.

LIST OF REFERENCE CHARACTERS 1 high voltage instrument transformer
2 housing
3 primary winding of measuring assembly
4 voltage transformer core of measuring assembly
5 isolator
6 vessel
7 base with earth connection
8 excess pressure means, particularly bursting disc
9 partial discharge sensor
10 ground screen
11 bushing
12 high voltage terminals
13 terminal box
14 electrical connection of the terminal box with the partial discharge sensor
15 fluid for electrical isolation, particularly isolation gas and/or oil

The invention claimed is:

1. A high voltage instrument transformer, comprising:
   an isolator,
   a vessel attached to the isolator,
   a measuring assembly enclosed in the vessel,
   a ground screen arranged enclosed by a passage between the isolator and the vessel, and
   at least one sensor for partial discharge measurements arranged on or directly arranged on the ground screen.

2. The high voltage instrument transformer according to claim 1, wherein the at least one sensor is a Transient Earth Voltage sensor.

3. The high voltage instrument transformer according to claim 1, wherein the at least one sensor is electrically connected to a ground screen.

4. The high voltage instrument transformer according to claim 1, wherein an outer shield of a bushing of the instrument transformer is electrically connected to a ground screen.

5. The high voltage instrument transformer according to claim 1, wherein the at least one sensor is arranged on or directly arranged on an outside surface of the isolator.

6. The high voltage instrument transformer according to claim 1, wherein the at least one sensor is arranged inside of the isolator.

7. The high voltage instrument transformer according to claim 1, wherein the at least one sensor is connected to a monitoring system, or to a continuous and/or online monitoring system.

8. The high voltage instrument transformer according to claim 7, wherein the monitoring system, or the continuous and/or online monitoring system, comprises a computer, and/or elements in the cloud, and/or mobile elements, for continuous monitoring and/or monitoring according to service intervals.

9. The high voltage instrument transformer according to claim 1, wherein the instrument transformer is designed for voltages in a range of a kilovolt up to 1200 kV.

10. A method for partial discharge recognition in high voltage instrument transformers according to claim 1, comprising:
    detecting a signal from at least one sensor for partial discharge measurements.

11. The method according to claim 10, comprising:
    transforming detected signals from time domain to frequency domain,
    cutting frequencies above a defined threshold value resulting in truncated signals,
    retransforming the truncated signals from frequency domain to time domain, and
    determining and comparing of information content of the detected signals and the truncated signals.

12. The method according to claim 11, wherein signals with comparable information content of the detected signal and the truncated signal are identified as noise, and/or signals with lower information content of the truncated signal compared to detected signal information content are identified as a signal including partial discharge information.

13. The method according to claim 11, wherein the determination of information content is performed by a calculation of Shannon entropy.

14. The high voltage instrument transformer according to claim 6, wherein the at least one sensor is arranged directly on a surface of the isolator.

15. The high voltage instrument transformer according to claim 9, wherein the instrument transformer is designed for voltages in a range of 15 kilovolt up to 1200 kV.

16. The method according to claim 10, wherein the sensor comprises a Transient Earth Voltage sensor.

\* \* \* \* \*